United States Patent
Wong et al.

(10) Patent No.: US 8,237,293 B2
(45) Date of Patent: Aug. 7, 2012

(54) SEMICONDUCTOR PACKAGE WITH PROTECTIVE TAPE

(75) Inventors: Tzu Ling Wong, Kuala Lumpur (MY); Boon Yew Low, Petaling Jaya (MY); Vemal Raja Manikam, Shah Alam (MY); Vittal Raja Manikam, Shah Alam (MY)

(73) Assignee: Freescale Semiconductor, Inc., Austin, TX (US)

( * ) Notice: Subject to any disclaimer, the term of this patent is extended or adjusted under 35 U.S.C. 154(b) by 51 days.

(21) Appl. No.: 12/874,225

(22) Filed: Sep. 2, 2010

(65) Prior Publication Data

US 2011/0121468 A1     May 26, 2011

(30) Foreign Application Priority Data

Nov. 25, 2009   (MY) .............................. PI 20095012

(51) Int. Cl.
*H01L 23/28* (2006.01)
*H01L 21/56* (2006.01)

(52) U.S. Cl. ......... 257/778; 257/E23.116; 257/E21.502; 257/787; 257/737; 257/738; 257/678; 438/127

(58) Field of Classification Search .................. 257/787, 257/E21.502, E23.116, 778, 737, 734, 738, 257/678; 438/127
See application file for complete search history.

(56) References Cited

U.S. PATENT DOCUMENTS

| | | | |
|---|---|---|---|
| 5,847,929 A * | 12/1998 | Bernier et al. | 361/719 |
| 6,514,797 B2 * | 2/2003 | Chee et al. | 438/127 |
| 6,617,682 B1 | 9/2003 | Ma | |
| 7,229,857 B2 * | 6/2007 | Zacherl et al. | 438/127 |
| 7,547,579 B1 * | 6/2009 | Jiang | 438/118 |
| 7,969,007 B2 * | 6/2011 | Noma et al. | 257/758 |
| 2002/0050642 A1 * | 5/2002 | Oota et al. | 257/738 |
| 2005/0206016 A1 * | 9/2005 | Shohji et al. | 257/787 |
| 2009/0130387 A1 * | 5/2009 | Contes et al. | 428/139 |
| 2011/0304991 A1 * | 12/2011 | Huang et al. | 361/719 |

* cited by examiner

*Primary Examiner* — A O Williams
(74) *Attorney, Agent, or Firm* — Charles Bergere

(57) ABSTRACT

An improved semiconductor package includes thermal tape placed over a top side of a die that is attached to a substrate with an underfill material. The tape extends to the substrate. The tape deforms with heat and entraps the die and underfill material. Air bubbles are trapped between the tape and the die and underfill material. The tape can be weighted and lined with an adhesive material. The tape aids in preventing the die from cracking due to mishandling.

20 Claims, 3 Drawing Sheets

SEMICONDUCTOR PACKAGE WITH PROTECTIVE TAPE

BACKGROUND OF THE INVENTION

The present invention relates generally to semiconductor packaging, and more particularly to an improved semiconductor package that has reduced susceptibility to cracking and a method of making the package.

As is well known, integrated circuits are formed on semiconductor dies. Such circuits are formed with multiple layers of materials, e.g., conductors and insulators that interconnect tiny transistors. The dies can be fragile and so must be protected. Further, because the dies are so small, they often are attached to a substrate that is used to interconnect the circuit formed in the die to other circuits. For example, the dies are susceptible to cracking especially at the corners caused by handling and pick-and-place machinery.

Referring now to FIG. 1, a partially packaged semiconductor device 10 is shown. The device 10 includes a semiconductor die 12 attached and electrically connected to a multi-layer wiring substrate 14. One way of attaching and electrically connecting the die 12 to the substrate 14 is with solder balls (not shown) attached to an underside of the die 12. The solder balls interconnect conductive terminals of the die 12 with the wiring pattern formed in the substrate 14. An underfill material 16 like epoxy is disposed in a gap between the die 12 and the substrate 14.

As discussed above, it is important that the die 12 is protected from damage during handling. One way to test the package integrity is to drop a weight 18 having a tip 20 on a corner of the die 12 to test the susceptibility of the die 12 to cracking.

Referring now to FIG. 2, an enlarged view of a portion of the die 12 and the underfill material 16 is shown. The underfill material 16 reaches to about half of the height of the die 12. For example, if the die 12 has a height of about 25 mils then the underfill material 16 has a height of about 12.5 mils. When the weight 18 is dropped onto the corner of the die 12, cracks are formed in an area 22 in the die 12. For the case where the underfill material 16 reaches to about half the height of the die 12, the cracks may extend to a depth of about 10.5 mils.

FIG. 3 shows a die 24 having underfill material 26 that extends about two-thirds up the side of the die 24. In this case, when the weight 18 is dropped onto the die 24, cracks have been measured to a depth of about 8.0 mils. That is, for a die having a height of 25.0 mils and the underfill material having a height of 16-17 mils, then the cracks indicated at cracking area 26 may extend to a depth of about 8.0 mils. Thus, although the depths of the cracks have been reduced, there is still room for improvement.

It would be advantageous to have a packaged device in which the risk of the die cracking was substantially reduced or eliminated.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION OF THE INVENTION

In one embodiment, the present invention provides a method for packaging a semiconductor die. The method includes attaching the semiconductor die to a substrate and disposing an underfill material between the semiconductor die and the substrate. Next, the die is covered with a piece of tape. The tape extends from a top side of the semiconductor die to the substrate.

In another embodiment, the present invention is a packaged semiconductor device. The device includes a semiconductor die attached to a substrate. An underfill material is disposed between the semiconductor die and the substrate. A tape is placed over the die and covers the die. The tape extends from a top side of the semiconductor die to the substrate.

In yet another embodiment, the present invention provides an improved packaged semiconductor device. The device includes a semiconductor die attached to a substrate. An underfill material is disposed between the semiconductor die and the substrate. A tape covers the semiconductor die. Preferably the tape extends from a top side of the semiconductor die to the substrate. The tape includes air bubbles trapped within its side portions, that is, those portions of the tape that that extend from the die top to the substrate.

Figure 4:
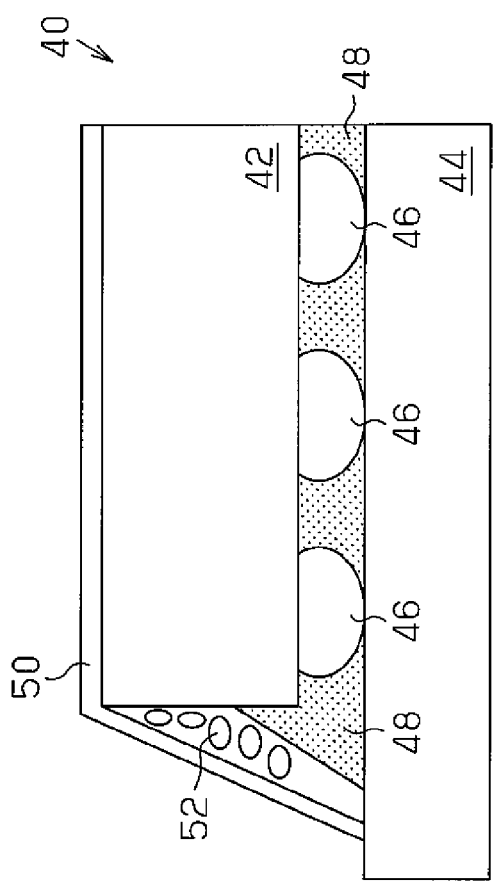
FIG. 4 is a greatly enlarged cross-sectional side view of a section of a packaged semiconductor device in accordance with an embodiment of the present invention.

Referring now to FIG. 4, an enlarged cross-sectional view of a portion of a semiconductor device 40 in accordance with an embodiment of the present invention is shown. The device 40 includes a semiconductor die 42 attached to and electrically connected to a substrate 44. The semiconductor die described herein can be any semiconductor material or combinations of materials, such as gallium arsenide, silicon germanium, silicon-on-insulator (SOI), silicon, monocrystalline silicon, the like, and combinations of the above.

Figure 1:
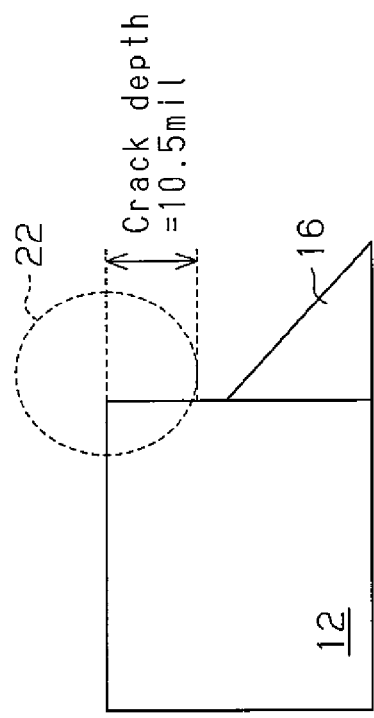
FIG. 1 is cross-sectional side view of a conventional packaged semiconductor device under going corner crack testing.
Figure 2:
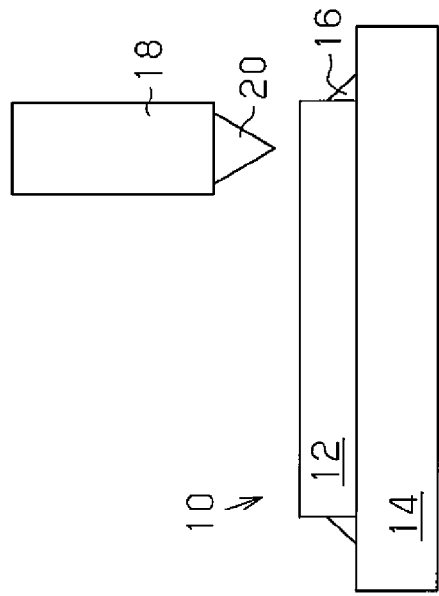
FIG. 2 is a greatly enlarged cross-sectional side view of the conventional packaged semiconductor device of FIG. 1.
Figure 3:
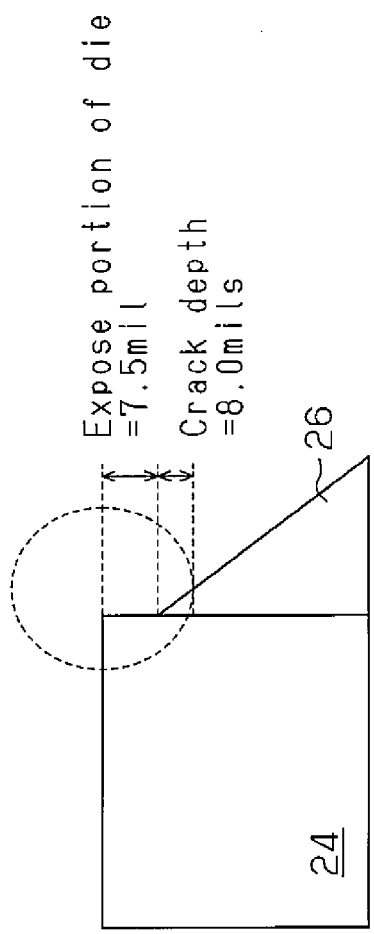
FIG. 3 is a greatly enlarged cross-sectional side view of another conventional packaged semiconductor device.

In the embodiment shown, the die 42 is electrically connected and attached to the substrate with a plurality of conductive balls 46 with a ball attach and reflow process. Such means for connecting and attaching a die to a substrate are well known to those of skill in the art so further description is not necessary for a complete understanding of the invention. Further, other means of attaching and connecting the die to the substrate also are known in the art and the present invention is not meant to be limited to the manner in which the die is connected to the substrate. An underfill material 48 is disposed between the semiconductor die 42 and the substrate 44. Underfill materials also are known in the art as are the manners of disposing the underfill material between the die and the substrate. Typical underfill materials are polymeric materials like liquid epoxy resin. In the embodiment shown, the underfill material 48 extends to less than about half-way up the die 42. However, the underfill material could extend higher (as shown in FIGS. 2 and 3).

A piece of tape 50 is placed over the die 42 and covers the die 42 and the underfill material 48 that is disposed outside of the area between the semiconductor die 42 and the substrate 44. That is, the tape 50 extends over the top side of the semiconductor die 42 and down both sides of the die 42 to the substrate 44. Here, the top side of the die refers to the die back side or the side of the die that does not have bond pads. The tape 50 may be provided on a reel (as discussed below with reference to FIG. 6) and is preferably heat-resistant, and may be infrared hardened. The tape 50 may be weighted and lined with an adhesive so that it adheres to the top of the die 42. Further, the tape 50 may be the type that shrinks or deforms when exposed to heat. Alternatively, a tape without an adhesive property can be used, if desired, which can decrease manufacturing. Preferably the tape 50 has a width of the same dimensions as a width of the die 42 or a bit wider (so that if it shrinks it will have the same dimensions as the die after shrinking) so that the tape 50 covers the entire top surface of the die 42. That is, the tape 50 deforms when exposed to heat and entraps the die 42 and underfill material 48. As can be seen in the drawing, air bubbles 52 may be trapped between the tape 50 and the underfill material 48 along the sides of the die 42. The tape 50 and the air bubbles 52 provide a cushion that protects the die 42 from cracking due to handling, e.g., by a pick and place machine.

Figure 5:
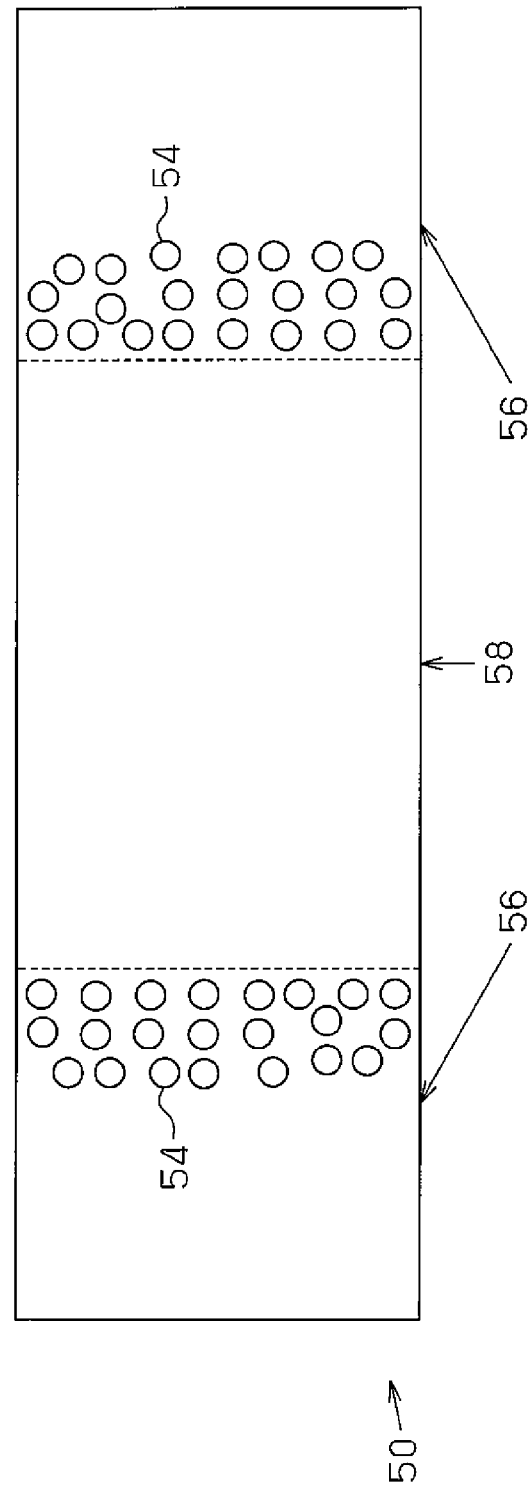
FIG. 5 is a top plan view of a piece of tape in accordance with an embodiment of the present invention.

FIG. 5 is an enlarged view of a piece of the tape 50. In this embodiment, the tape 50 includes air bubbles 54 trapped within the tape 50 at side portions 56 of the tape 50. A center portion 58 of the tape 50 is that portion of the tape that covers the top of the die 42. Thus, the center portion 58 is sized and shaped depending on the size and shape of the die 42. Although in the embodiment shown the air bubbles 54 are located only at the upper parts (e.g., closer to die top) of the side portions, in other embodiments, the air bubbles could be disposed throughout the tape, or at the die top area and the upper parts of the side portions. The tape 50 may comprise a silicone coated polyester film (PE) film material.

Figure 6:
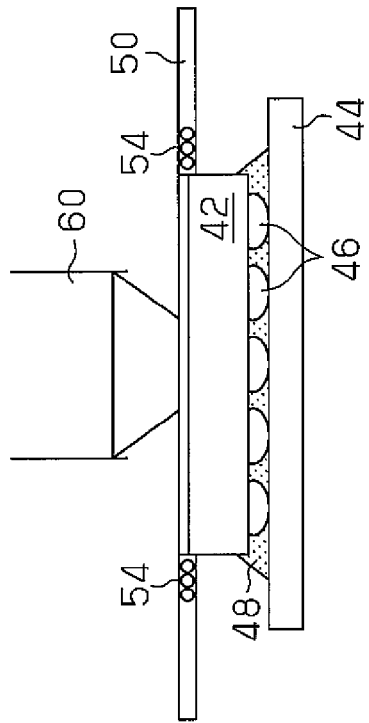
FIG. 6 is a greatly enlarged cross-sectional side view of a semiconductor device being packaged in accordance with an embodiment of the present invention.
Figure 7:
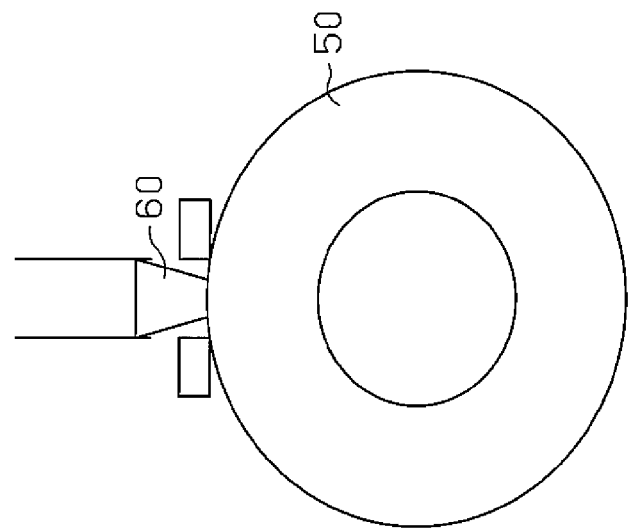
FIG. 7 is an enlarged side view illustrating equipment used for packaging the semiconductor device of FIG. 6 in accordance with an embodiment of the present invention.
Figure 8:
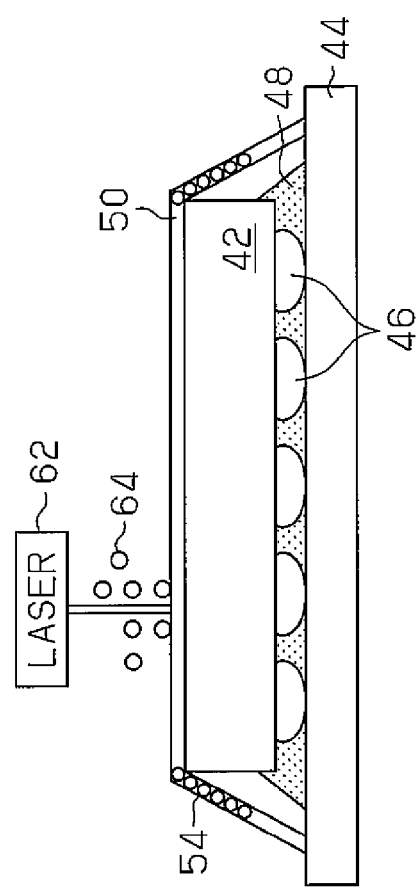
FIG. 8 is a greatly enlarged side view of the semiconductor device shown in FIG. 6 during a laser marking step in the packaging process.

Referring now to FIGS. 6, 7 and 8, steps in a method for packaging a semiconductor die are shown. FIG. 6 shows the die 42 attached to the substrate 44. The die 42 is in electrical contact with the substrate 44 by way of solder balls 46. An underfill material 48 is disposed between the die 42 and the substrate 44 and surrounds the solder balls 46. Note that some of the underfill material 48 is disposed outside of the area between the semiconductor die 42 and the substrate 44. The tape 50 will cover the sides of the die and the underfill material 48. In FIG. 5, the tape 50 is being placed over a top (i.e., the back side) of the die 42 with a machine head 60. The tape 50 covers the die and extends from the top surface of the die 42.

FIG. 7 shows the tape 50 wound around a reel and the machine head 60 that is used to place the tape 50 over the die 42. FIG. 8 shows the tape 50 after it has been placed over the die 42 and heated so that the tape 50 has deformed and surrounds the die 42 and underfill material 48. As previously discussed, in one embodiment, air bubbles are trapped between the die 42 and the tape 50 along the sides of the die 42, and in another embodiment, the tape 50 has air bubbles trapped within portions thereof that extend from the top of the die to the substrate. FIG. 8 also illustrates a step of marking the die top with a laser 62. Such markings are used to identify the die 42 and for example, when and where the assembly operation when was performed.

By now it should be appreciated that there has been provided an improved semiconductor package and a method of making the improved semiconductor package. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. For example, the height of the underfill material relative to the height of the die may vary. Also, the air bubbles trapped between the tape and the underfill material are not necessary, and such air bubbles could be bled off before encapsulating the die with the encapsulation material. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method for packaging a semiconductor die, the method comprising:

attaching and electrically connecting the semiconductor die to a substrate;

disposing an underfill material between the semiconductor die and the substrate; and covering the semiconductor die with a piece of tape, wherein the tape extends from a top side of the semiconductor die to the substrate.

2. The method for packaging a semiconductor die of claim 1, wherein the tape includes a plurality of air bubbles trapped within.

3. The method for packaging a semiconductor die of claim 2, wherein the plurality of air bubbles is trapped within side portions of the tape.

4. The method for packaging a semiconductor die of claim 1, wherein some of the underfill material is disposed outside of the area between the semiconductor die and the substrate, and wherein the tape covers said underfill material disposed outside of said area.

5. The method for packaging a semiconductor die of claim 1, further comprising heating the tape so that the tape deforms when exposed to the heat and entraps the die and underfill material.

6. The method for packaging a semiconductor die of claim 1, wherein air bubbles are trapped between the tape and the die.

7. The method for packaging a semiconductor die of claim 1, wherein the semiconductor die includes a plurality of conductive balls on a bottom surface thereof, and wherein attaching the semiconductor die to the substrate comprises performing a solder reflow process.

8. The method of packaging a semiconductor die of claim 1, wherein the tape is weighted and lined with an adhesive material that affixes the tape to the top side of the die.

9. A packaged semiconductor device, comprising:
   a semiconductor die attached and electrically connected to a substrate;
   an underfill material disposed between the semiconductor die and the substrate; and
   a tape covering the semiconductor die, wherein the tape extends from a top side of the semiconductor die to the substrate.

10. The packaged semiconductor device of claim 9, wherein a plurality of air bubbles is trapped within the tape.

11. The packaged semiconductor device of claim 10, wherein the plurality of air bubbles is trapped within side portions of the tape.

12. The packaged semiconductor device of claim 9, wherein some of the underfill material is disposed outside of the area between the semiconductor die and the substrate, and wherein the tape covers said underfill material disposed outside of said area.

13. The packaged semiconductor device of claim 9, wherein the tape has been deformed by exposure to heat such that the tape entraps the die and underfill material.

14. The packaged semiconductor device of claim 9, wherein air bubbles are trapped between the tape and the die.

15. The packaged semiconductor device of claim 9, wherein the semiconductor die includes a plurality of conductive balls on a bottom surface thereof, and wherein the semiconductor die is attached to the substrate by performing a solder reflow process.

16. The packaged semiconductor device of claim 9, wherein the tape is weighted and lined with an adhesive material that affixes the tape to the top side of the die.

17. An improved packaged semiconductor device, comprising:
   a semiconductor die attached and electrically connected to a substrate;
   an underfill material disposed between the semiconductor die and the substrate; and
   a tape covering the semiconductor die, wherein the tape extends from a top side of the semiconductor die to the substrate, and wherein a plurality of air bubbles are trapped within side portions of the tape.

18. The improved packaged semiconductor device of claim 17, wherein the tape is weighted and lined with an adhesive material that affixes the tape to the top side of the die.

19. The improved packaged semiconductor device of claim 18, wherein the tape has been deformed by exposure to heat such that the tape entraps the die and underfill material.

20. The improved packaged semiconductor device of claim 19, wherein air bubbles are trapped between the tape and the die.

* * * * *